United States Patent
Saho

(10) Patent No.: US 6,347,356 B2
(45) Date of Patent: *Feb. 12, 2002

(54) BURST LENGTH DISCRIMINATING CIRCUIT FOR USE IN SYNCHRONOUS SEMICONDUCTOR MEMORY AND HAVING A PREDETERMINED INITIALIZED STATE OF POWER-UP

(75) Inventor: Kazuhisa Saho, Kanagawa (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,619

(22) Filed: Dec. 9, 1998

(30) Foreign Application Priority Data

Dec. 10, 1997 (JP) ............................................. 9-339818

(51) Int. Cl.[7] .................. G06F 13/28; G06F 13/00; G11C 11/4072; G11C 11/4096

(52) U.S. Cl. ...................... 711/104; 711/105; 711/167; 365/189.03; 365/230.08; 365/230.06; 365/238.5

(58) Field of Search ................................ 711/167, 104, 711/105; 365/189.03, 189.05, 230.08, 233, 230.06, 238.5; 710/35

(56) References Cited

U.S. PATENT DOCUMENTS

| | | | | |
|---|---|---|---|---|
| 5,408,435 A | * | 4/1995 | McClure et al. | 365/201 |
| 5,526,320 A | | 6/1996 | Zagar et al. | 365/233.5 |
| 5,659,515 A | | 8/1997 | Matsuo et al. | 365/222 |
| 5,699,302 A | * | 12/1997 | Shinozak et al. | 365/189.05 |
| 5,732,034 A | * | 3/1998 | Asakura et al. | 365/230.08 |
| 5,757,715 A | * | 5/1998 | Williams et al. | 365/189.05 |
| 5,781,500 A | * | 7/1998 | Oh | 365/233 |
| 5,805,928 A | * | 9/1998 | Lee | 710/35 |
| 5,881,017 A | * | 3/1999 | Matsumoto et al. | 365/230.04 |
| 5,905,681 A | * | 5/1999 | Matsui | 365/230.06 |
| 6,038,648 A | * | 3/2000 | Nakaoka | 711/104 |

FOREIGN PATENT DOCUMENTS

| | | |
|---|---|---|
| EP | 0 618 585 | 10/1994 |
| JP | 9-251773 | 9/1997 |
| WO | 9813828 | * 4/1998 |

* cited by examiner

Primary Examiner—Glenn Gossage
(74) Attorney, Agent, or Firm—Young & Thompson

(57) ABSTRACT

A burst length discriminating circuit for use in a synchronous semiconductor memory with a burst mode, which receives the three least significant address signals of an address, includes an inverter receiving the address IA2, a first D-type flipflop or latch for latching and holding the address signal IA0, a second D-latch for latching and holding the address signal IA1, and a third D-latch for latching and holding an output of the inverter. A decoder receives respective outputs of the first to third D-latches for selectively activating a burst length discrimination signal determined by a logical combination of the address signals IA0, IA1 and IA2, and activates an any burst length discrimination signal other than a burst length discrimination signal indicating the full page, when the outputs of all the first to third D-latches are at the high level. Thus, even if a read mode is erroneously selected at a power-on time, a burst length other than a full page is selected, and during a bus check after a power-on of the system, a large current caused by output pins continuing to output data does not occur. Additionally, in a system having a plurality of synchronous semiconductor memory circuits having the burst mode and connected to a common memory bus, write data supplied to a semiconductor memory circuit under test is not destroyed and an inconvenience during memory checking is presented.

19 Claims, 3 Drawing Sheets

TRUTH TABLE OF DECODER

| IA2Q | IA1Q | IA0Q | MDBL1 | MDBL4 | MDBL8 | MDBLF |
|------|------|------|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 0 | 1 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 1 | 0 |

TRUTH TABLE OF BURST LENGTH DISCRIMINATING CIRCUIT

| IA2 | IA1 | IA0 | MDBL1 | MDBL4 | MDBL8 | MDBLF |
|-----|-----|-----|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 1 | 0 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 0 | 1 |

Fig. 6 PRIOR ART

TRUTH TABLE OF DECODER

| IA2Q | IA1Q | IA0Q | MDBL1 | MDBL4 | MDBL8 | MDBLF |
|------|------|------|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 1 | 0 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 0 | 1 |

Fig. 7 PRIOR ART

TRUTH TABLE OF BURST LENGTH DISCRIMINATING CIRCUIT

| IA2 | IA1 | IA0 | MDBL1 | MDBL4 | MDBL8 | MDBLF |
|-----|-----|-----|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 1 | 0 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 0 | 1 |

BURST LENGTH DISCRIMINATING CIRCUIT FOR USE IN SYNCHRONOUS SEMICONDUCTOR MEMORY AND HAVING A PREDETERMINED INITIALIZED STATE OF POWER-UP

BACKGROUND OF THE INVENTION

1. Field of the Invention

The present invention relates to a semiconductor memory, and more specifically to a burst length discriminating circuit for use in a synchronous semiconductor memory with a burst mode.

2. Description of Related Art

In the prior art, a synchronous semiconductor memory circuit having a burst mode has been known.

In the prior art semiconductor memory circuit having the burst mode, as shown in FIG. 4, a mode discriminating circuit 100 receives various control signals including at least a row address strobe signal RAS, a column address strobe signal CAS, and an internal address (only one address signal IA11, of which is shown in FIG. 4), and outputs various mode signals labeled "MODE FLAGS". The mode discriminating circuit 100 is initialized by a power-on-reset signal PON supplied to a reset input of the mode discriminating circuit 10.

The inputted signals are held in D-latches (not shown) during a high level period of an internal clock CLK which is brought to a high level during a predetermined period of time from a rising of an external clock. "D-latches" refers to D-type flip flops or latches. Outputs of the D-latches (not shown) are connected to a decoder (not shown) so that the outputs of the D-latches are converted by action of the decoder into mode signals in accordance with a combination of the inputted signals. Each mode signal is held in a D-latch until a rising of a next internal clock CLK.

Referring to FIG. 5, there is shown a logic circuit diagram of a burst length discriminating circuit included in the prior art semiconductor memory circuit having the burst mode. FIG. 6 is a truth table of a decoder section of the burst length discriminating circuit, and FIG. 7 is a truth table of the burst length discriminating circuit.

The shown prior art burst length discriminating circuit includes three D-latches (D-type flipflops) 1, 2 and 3, and a decoder 20 which is constituted of a two-input NOR gate 4, a two-input NAND gate 5, a three-input NOR gate 6, a three-input NAND gate 7 and four inverters 9, 10, 11 and 12, connected as shown. The D-latches (D-type flipflops) 1, 2 and 3 latch three least significant address bits "IA0", "IA1" and "IA2" of the address, in synchronism with a rising of the internal clock CLK in a mode register set cycle, and hold the latched address bits "IA0", "IA1" and "IA2" until the rising of the next the internal clock CLK.

The decoder 20 selectively activates a burst length discrimination signal on the basis of the logical combination of the address bits "IA0", "IA1" and "IA2". The relation between the burst lengths and the address signals corresponding to key address signals is defined in Joint Electron Device Engineering Council ("JEDEC") format as shown in FIG. 7. Therefore, when all of the address bits "IA0", "IA1" and "IA2" are at a high level, the burst length discrimination signal MDBLF indicating the full page burst is activated. In order to realize the truth table shown in FIG. 7, the decoder 20 is configured to realize the truth table shown in FIG. 6. Namely, the truth table of the burst length discriminating circuit is the same as that of the decoder included in the burst length discriminating circuit, and therefore, the latches provided in the burst length discriminating circuit supply the decoder with the address signals having the same polarity as those applied to the burst length discriminating circuit.

At a power-on time, initial conditions of the D-latches and sequential circuits (not shown) are indefinite. Therefore, the D-latches and sequential circuits are initialized by the power-on-reset signal PON (internal initializing signal) at the power-on time, so that the semiconductor memory circuit becomes an expected predetermined internal condition.

In general, in a system such a personal computer or a work station, if a voltage is applied to an input/output pin of the semiconductor memory circuit, a minute current flows in an input protection circuit provided in the input/output pin. By utilizing this feature, just after the power-on, a bus check, in order to check whether or not a semiconductor memory circuit exists on the memory bus, is carried out by monitoring a minute current flowing when a voltage is applied to the memory bus.

In the system having the prior art semiconductor memory circuit having the burst mode, on the other hand, if the power-on-reset signal were not generated for any reason at the power-on time, the internal condition is not initialized, and the system may not return to a normal condition. As a result, if the input/output pin of the semiconductor memory circuit is in a condition of outputting the data, a large current flows, and therefore, the bus check cannot be performed.

Specifically, since the initial conditions of the D-latches and sequential circuits are indefinite at the power-on time, various internal nodes which were at the ground level at the power-on time elevate with elevation of the power supply voltage, wherein each various internal node finally becomes either the low level or the high level to which the internal node is apt to shift because of variation of an individual circuit element in a manufacturing process. As a result, the semiconductor memory circuit becomes an unexpected internal condition. However, even if the initialization results in failure, if a mode erroneously selected by the mode discriminator was a mode register setting mode, a refresh mode, or a write mode, the input/output pins are put in a high impedance condition, and therefore, no large current disadvantageously flows at the bus checking of the system.

In addition, even if the erroneously selected mode was a read mode, if the burst length selected by the burst length discriminating circuit is any of the burst lengths "1", "2","4" and "8", after the data corresponding to the designated burst length is outputted in synchronism with an external clock, the input/output pins are brought into the high impedance condition. Therefore, no substantial problem occurs.

However, if the erroneously selected mode is the read mode, and if the burst length selected by the burst length discriminating circuit is the full page (full page burst read mode), the input/output pins are maintained in a data outputting condition until a burst stop command, a precharge command or a write command (excluding the case that a CAS latency is "3") is inputted. Namely, since the data continues to be outputted in synchronism with the external clock, a large current disadvantageously flows at the bus checking of the system.

Here, considering the burst length discriminating circuit, all the D-latches included in the burst length discriminating circuit have the same circuit construction and are formed in the same mask pattern. Therefore, at the power-on time, outputs of all the D-latches included in the burst length discriminating circuit are apt to become the same logical level which is either a high level or a low level.

Since the input-output relation of the decoder required to cause the burst length discriminating circuit to meet the relation between the key address signals and the burst lengths defined in JEDEC as shown in FIG. 7, is as shown in FIG. 6, when all the inputs of the decoder are at a high level, the full page is selected as the burst length.

In addition, in a system such as a personal computer or a work station, a memory check is carried out just after a power-on time, in order to check whether or not the semiconductor memory existing on the memory bus operates normally, by executing a reading and writing of data. In a high speed system having a plurality of semiconductor memories having the burst mode, connected to the memory bus, in parallel to one another, the plurality of semiconductor memories are checked one by one in order. In this case, not only the output pins of the semiconductor memory to be checked but also the output pins of the semiconductor memories not to be checked are connected to the same memory bus. Therefore, if the output pins of at least one of the semiconductor memories not to be checked are in the data outputting condition (namely, in the full page burst read mode) (because the semiconductor memory was not properly initialized at the power-on time), the data supplied from the system is destroyed, and therefore, the data supplied from the system is not properly written into the semiconductor memory to be checked, with the result that the result of the memory checking becomes error.

SUMMARY OF THE INVENTION

Accordingly, it is an object of the present invention to provide a burst length discriminating circuit for use in a synchronous semiconductor memory with a burst mode which has overcome the above mentioned conventional defect.

Another object of the present invention is to provide a burst length discriminating circuit for use in a synchronous semiconductor memory with a burst mode, which will not select the burst length of the full page when the semiconductor memory is not properly initialized at a power-on time.

The above and other objects of the present invention are achieved in accordance with the present invention by a burst length discriminating circuit for use in a synchronous semiconductor memory with a burst mode, comprising:

a plurality of holding means for latching and holding a corresponding number of address signals;

at least one inverting means receiving one address signal of the address signals for supplying an inverted address signal to a corresponding holding means of the plurality holding means; and a decoding means receiving outputs of the plurality of holding means for selectively activating one of a plurality of burst length discrimination signals determined by a combination of logical values of the address signals, the decoding means activating a burst length discrimination signal indicating a burst length other than a full page when the outputs of all the plurality of holding means are at the same logical level.

In an embodiment of the burst length discriminating circuit, the plurality of holding means hold respective address signals in synchronism with a clock signal. Specifically, each of the plurality of holding means comprises a D-type flipflop having a data input connected to receive a corresponding input signal and a clock input connected to receive the clock signal.

Furthermore, the decoding means includes a plurality of logic circuits connected to selectively activate the burst length discrimination signal determined by the combination of logical values of the address signals, and to activate a burst length discrimination signal indicating a burst length other than the full page when the outputs of all the plurality of holding means are at the same logical level.

In a preferred embodiment, the burst length discriminating circuit receives the three least significant address signals of an address, and the plurality of holding means comprising three holding means for receiving the three least significant address signals, respectively, wherein the at least one inverting means receives one of the three least significant address signals to output the inverted address signal to the corresponding holding means of the three holding means. The decoding means receives outputs of the three holding means, and activates a burst length discrimination signal indicating a burst length of 8 bits when all outputs of the three holding means are at the same logical level at the power-on time. The at least one inverting means receives the most significant address signal of the three least significant address signals to output an inverted address signal to the corresponding holding means of the three holding means.

In a specific preferred embodiment, the at least one inverting means includes an inverter receiving the most significant address signal of the three least significant address signals to output the inverted address signal. The three holding means include a first D-type flipflop having a data input connected to latch and hold the least significant address signal of the three least significant address signals in response to a clock signal, a second D-type flipflop having a data input connected to latch and hold the second least significant address signal of the three least significant address signals in response to clock signal, and a third D-type flipflop having a data input connected to latch and hold the inverted address signal in response to clock signal. The decoding means includes a two-input NOR circuit receiving an output of the first D-type flipflop and an output of the second D-type flipflop and outputting a first burst length discrimination signal, a two-input AND circuit receiving an inverted signal of the output of the first D-type flipflop and the output of the second D-type flipflop and outputting a second burst length discrimination signal, a three-input AND circuit receiving the output of the first D-type flipflop, the output of the second D-type flipflop and an output of the third D-type flipflop, and outputting a third burst length discrimination signal, and a three-input NOR circuit receiving the inverted signal of the output of the first D-type flipflop, an inverted signal of the output of the second D-type flipflop and an output of the third D-type flip-flop, an outputting a fourth burst length discrimination signal indicating the full page.

The above and other objects, features and advantages of the present invention will be apparent from the following description of preferred embodiments of the invention with reference to the accompanying drawings.

BRIEF DESCRIPTION OF THE DRAWINGS

FIG. 6 is a truth table of a decoder section of the burst length discriminating circuit shown in FIG. 5; and FIG. 7 is a truth table of the burst length discriminating circuit shown in FIG. 5.

DESCRIPTION OF THE PREFERRED EMBODIMENTS

Figures 1, 2, 3:
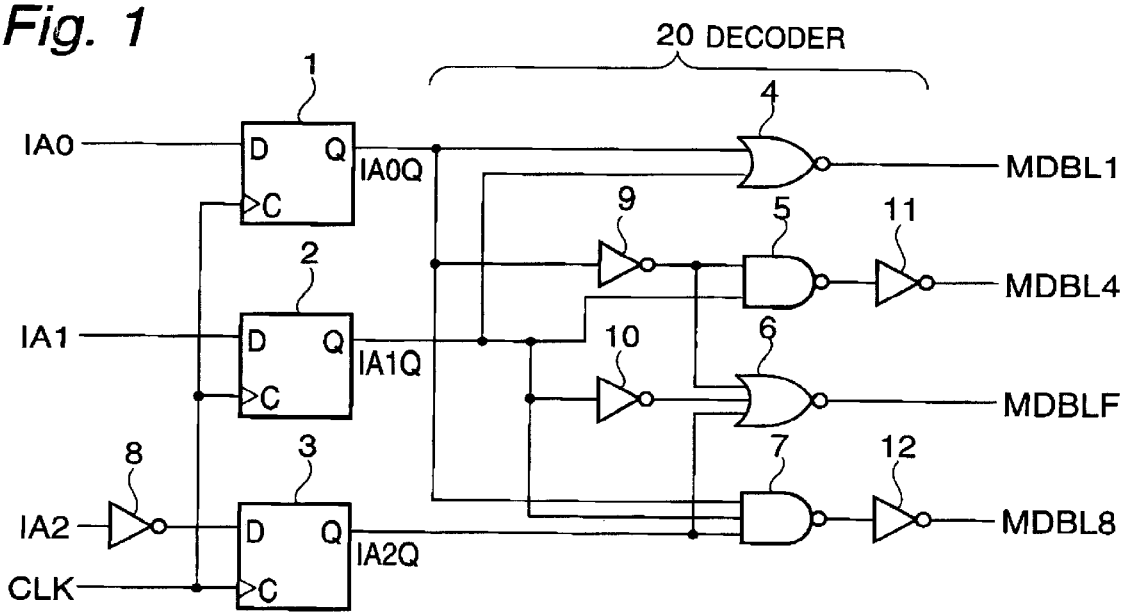
FIG. 1 is a logic circuit diagram of the burst length discriminating circuit in an embodiment of a semiconductor memory circuit having a burst mode in accordance with the present invention.
FIG. 2 is a truth table of a decoder section of the burst length discriminating circuit shown in FIG. 1.
FIG. 3 is a truth table of the burst length discriminating circuit shown in FIG. 1.
Figure 4:
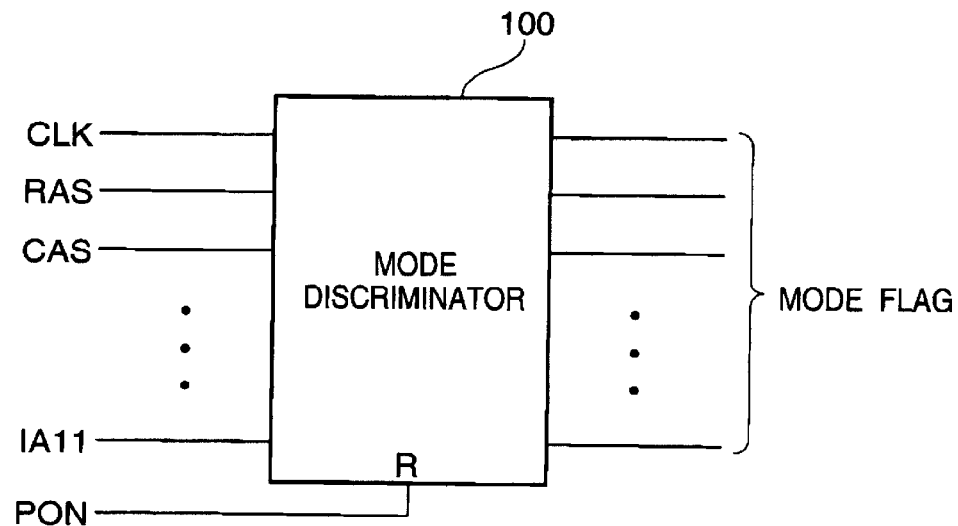
FIG. 4 illustrates inputs and outputs of the mode discriminating circuit in the prior art semiconductor memory circuit having a burst mode.
Figure 5:
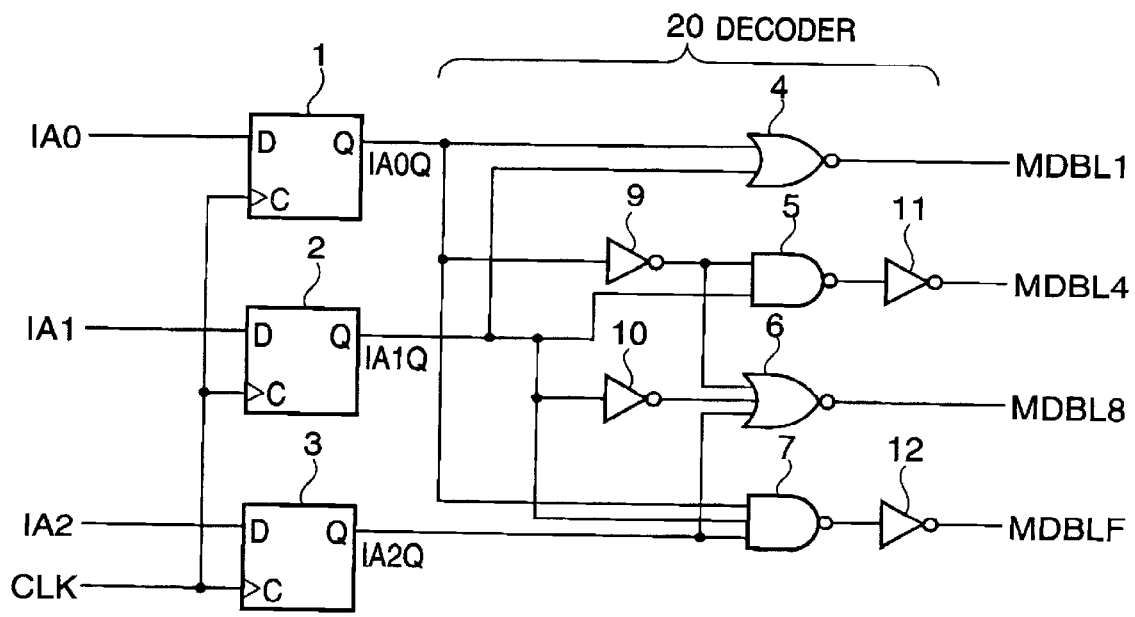
FIG. 5 is a logic circuit diagram of the burst length discriminating circuit in the prior art semiconductor memory circuit having the burst mode.

Referring to FIG. 1, there is shown a logic circuit diagram of the burst length discriminating circuit in an embodiment of the semiconductor memory circuit in accordance with the present invention having a full page burst write/read function. In FIG. 1, elements corresponding to those shown in FIG. 5 are given the same Reference Numerals.

The shown burst length discriminating circuit includes three D-latches (D-type flipflops) 1, 2 and 3, an inverter 8, and a decoder 20 which is constituted of a two-input NOR gate 4, a two-input NAND gate 5, a three-input NOR gate 6, a three-input NAND gate 7 and four inverters 9, 10, 11 and 12, connected as shown. As seen from comparison between FIG. 1 and FIG. 5, the shown burst length discriminating circuit has the same circuit construction as that of the prior art burst length discriminating circuit shown in FIG. 5, except that the inverter 8 is inserted before the input of the latch 3 receiving the key address signal IA2.

More specifically, the shown burst length discriminating circuit receives internal address signals "IA0", "IA1" and "IA2" corresponding to the three least significant bits "A0", "A1" and "A2" of an external address (not shown), respectively. Therefore, the internal address signals "IA0", "IA1" and "IA2" are key address signals for the burst length discriminating circuit, and supplied to a data input "D" of the D-latch 1, a data input "D" of the D-latch 2, and an input of the inverter 8, respectively. An output of the inverter 8 is connected to a data input "D" of the D-latch 3. A clock input "D" of each of the three D-latches 1, 2 and 3 is connected to receive an internal clock CLK in phase with an external clock (not shown) so that each of D-latches 1, 2 and 3 latches the corresponding input address signal in response to a rising of the internal clock CLK in a mode register set cycle, and holds the latched address signal until the rising of the next internal clock CLK. The three D-latches 1, 2 and 3 have the same circuit construction and are constructed with the same mask pattern.

Outputs of the three D-latches 1, 2 and 3 are supplied to the decoder 20. Specifically, an output "IA0Q" of the D-latch 1 is connected to a first input of the two-input NOR gate 4, an input of the inverter 9 and a first input of the three-input NAND gate 7. An output "IA1Q" of the D-latch 2 is connected to a second input of the two-input NOR gate 4, a first input of the two-input NAND gate 5, an input of the inverter 10 and a second input of the three-input NAND gate 7. A output "IA2Q" of the D-latch 3 is connected to a first input of the three-input NOR gate 6 and a third input of the three-input NAND gate 7. An output of the inverter 9 is connected to a second input of the two-input NAND gate 5 and a second input of the three-input NOR gate 6. An output of the inverter 10 is connected to a third input of the three-input NOR gate 6.

An output of the two-input NOR gate 4 outputs a first burst length discrimination signal "MDBL1", which is brought to a high level when the burst length is 1 bit. An output of the two-input NAND gate 5 is connected to an input of the inverter 11, and an output of the inverter 11 outputs a second burst length discrimination signal "MDBL4", which is brought to a high level when the burst length is 4 bits. An output of the three-input NAND gate 7 is connected to an input of the inverter 12, and and output of the inverter 12 outputs a third burst length discrimination signal "MDBL8", which is brought to a high level when the burst length is 8 bits. An output of the three input NOR gate 6 outputs a fourth burst length discrimination signal "MDBLF", which is brought to a high level when the burst length is the full page. In the above construction, a two-input AND circuit is constituted of the two-input NAND gate 5 and the inverter 11, and a three-input AND gate circuit is constituted of the three-input NAND gate 7 and the inverter 12.

Referring to FIG. 2, there is shown a truth table of the decoder 20 receiving the outputs "IA0Q", "IA1Q" and "IA2Q" of the three D-latches 1, 2 and 3.

As seen from the truth table of FIG. 2, even if all the outputs of the D-latches 1, 2 and 3 are at the high level at the power-on time, only the burst length discrimination signal "MDBL8" is activated so that the burst length of 8 bits is selected. Therefore, even if the memory is put in a reading mode at the power-on time, since the burst length other than the full page is selected, after the data of the amount corresponding to the selected burst length is outputted in synchronism with the external clock, the output pins are brought into a high impedance condition, so that the semiconductor memory circuit is put in a condition ready to receive an input. Thus, the inconvenience occurring in the prior art has been prevented, since the burst length of the full page is in no way selected at the power-on time.

Referring to FIG. 3, there is shown a truth table of the burst length discriminating circuit shown in FIG. 1. As seen from a comparison between FIG. 3 and FIG. 7, the truth table of the burst length discriminating circuit shown in FIG. 3 is the same as the truth table of the burst length discriminating circuit shown in FIG. 7, provided in the prior art semiconductor memory circuit having the burst mode. Therefore, in a situation excluding the power-on time, the burst length discriminating circuit shown in FIG. 1 operates similarly to the burst length discriminating circuit provided in the prior art semiconductor memory circuit having the burst mode.

As seen from the above, the shown embodiment of the burst length discriminating circuit of the semiconductor memory circuit having the burst mode is characterized in that at least one of the D-latches latching the key address signals supplied to the burst length discriminating circuit is connected to receive through one inverter the corresponding key address signal, contrary to the prior art ordinary sense in which the latch (flipflop) is connected to output an internal signal having the same polarity as that of an external signal externally supplied to the latch. Here, of course, two or more of the key address signals supplied to the burst length discriminating circuit can be supplied through inverters to the corresponding latches, if all of the key address signals supplied to the burst length discriminating circuit are not supplied through inverters. On the other hand, since at least one of the key address signals supplied to the burst length discriminating circuit is supplied through an inverter to the corresponding latch, the decoder receiving the output of the latches is so modified to have a logic construction which never changes the logical relation between the key address signal and the output of the burst length discriminating circuit. In the shown embodiment, however, the decoder shown in FIG. 1 is the same on logic circuit construction as that of the decoder of the prior art burst length discriminating circuit, but that the burst length discrimination signal "MDBL8" and the burst length discrimination signal "MDBLF" are exchanged. Therefore, the shown embodiment can advantageously realize the present invention with a minimum modification of the prior art circuit.

Thus, even if all the latches receiving the key address signals in the burst length discriminating circuit output the high level signal or the low level signal at the power-on time, the burst length other than the full page is selected. Accordingly, even if the semiconductor memory circuit in accordance with the present invention having the burst mode is put in a real mode at the power-on time, a burst length other than the full page is selected, so that, after information corresponding to the burst length (8 bits at a maximum) is outputted in synchronism with the external clock, the output pins are brought into a high impedance condition, and therefore, the semiconductor memory circuit is put in a condition ready to receive an input signal. Thus, inconvenience does not occur at a memory checking time or at a bus checking time in a personal computer or a work station.

As seen from the above, the synchronous semiconductor memory circuit in accordance with the present invention having the burst mode is features in that the burst length discriminating circuit has a plurality of latches for latching and holding a corresponding number of key address signals, at least one inverter receiving one key address signal of the key address signals for supplying an inverted key address signal to a corresponding latch of the plurality of latches, and a decoder receiving outputs of the plurality of latches for selectively activating one of plural burst length discrimination signals, so that when all of the inputs of the decoder are at the high level or at the low level, the decoder activates the burst length discrimination signal indicating the burst length other than the full page.

With this arrangement, even if a read mode is erroneously selected at the power-on time, a burst length other than the full page is selected. Accordingly, when information corresponding to the burst length has been outputted in synchronism with the external clock supplied after the power-on, the output pins are brought into a high impedance condition until the bus checking is conducted. Therefore, even if a voltage is supplied from the system, since the output pins are in the high impedance condition, no large current flows. Thus, in the bus check just after the power-on in the system such as a personal computer on a work station, there does not occur such inconvenience that a large current flows when because the output pins are in a condition continuing to output the data.

Furthermore, since the output pins are in the high impedance condition, a write data supplied from the system is never destroyed. Therefore, in the high speed system such as the personal computer or the work station having a plurality of synchronous semiconductor memory circuits having the burst mode, connected to a common memory bus, in parallel to one another, the write data supplied from the system to the semiconductor memory circuit under test, is never destroyed by an output data from another semiconductor memory circuit connected to the memory bus to which the semiconductor memory circuit under test is connected. Accordingly, the inconvenience at the memory checking is prevented.

The invention has thus been shown and described with reference to the specific embodiments. However, it should be noted that the present invention is in no way limited to the details of the illustrated structures but changes and modifications may be made within the scope of the appended claims.

What is claimed is:

1. A burst length discriminating circuit for use in a synchronous semiconductor memory with a burst mode, comprising:
   a plurality of holding means for latching and holding a corresponding number of address signals;
   at least one inverting means receiving one address signal of said address signals for supplying an inverted address signal to a corresponding holding means of said plurality of holding means; and
   a decoding means receiving outputs of said plurality of holding means for selectively activating one of a plurality of burst length discrimination signals determined by a combination of logical values of said address signals, said decoding means activating a burst length discrimination signal indicating a burst length other than a full page when the outputs of all said plurality of holding means are all in a high state and when the outputs of all said plurality of holding means are all in a low state,
   wherein when the outputs of all said plurality of holding means are all in a high state and when the outputs of all said plurality of holding means are all in a low state said decoding means never selects the burst length discrimination signal indicative of the full page.

2. A burst length discriminating circuit claimed in claim 1 wherein said decoding means includes a plurality of logic circuits connected to selectively activate the burst length discrimination signal determined by the combination of logical values of said address signals, and to activate a burst length discrimination signal indicating a burst length other than the full page when said outputs of all said plurality of holding means are at the same logical level.

3. The burst length discriminating circuit of claim 1, wherein, during a power-on, when the outputs of all said plurality of holding means are all in a high state and when the outputs of all said plurality of holding means are all in a low state, said decoding means never selects the burst length discrimination signal indicative of the full page.

4. The burst length discriminating circuit of claim 1, wherein, the truth table of the decoder is:

| IA2Q | IA1Q | IA0Q | MDBL1 | MDBL4 | MDBL8 | MDBLF |
|------|------|------|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 0 | 1 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 1 | 0 |

IA2Q, IA1Q, and IA0Q being decoder inputs and MDBL1, MDBL4, MDBL8, and MDBLF being decoder outputs, and
the truth table of the burst length discriminating circuit is:

| IA2 | IA1 | IA0 | MDBL1 | MDBL4 | MDBL8 | MDBLF |
|-----|-----|-----|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 1 | 0 |
| 1 | 0 | 0 | 1 | 0 | 0 | 0 |

-continued

| IA2 | IA1 | IA0 | MDBL1 | MDBL4 | MDBL8 | MDBLF |
|-----|-----|-----|-------|-------|-------|-------|
| 1   | 0   | 1   | 0     | 0     | 0     | 0     |
| 1   | 1   | 0   | 0     | 1     | 0     | 0     |
| 1   | 1   | 1   | 0     | 0     | 0     | 1     |

IA2, IA1, and IA0 being the address signals.

5. A burst length discriminating circuit claimed in claim 1 wherein,
   said plurality of holding means hold respective address signals in synchronism with a clock signal, and
   there is exactly one of the inverting means so that one of the holding means receives an inverted address signal and the other holding means receive non-inverted address signals.

6. A burst length discriminating circuit claimed in claim 5 wherein each of said plurality of holding means comprises a D-type flipflop having a data input connection to receive a corresponding input signal and a clock input connected to receive said clock signal.

7. A burst length discriminating circuit claimed in claim 1 wherein
   the burst length discriminating circuit receives the three least significant address signals of an address,
   said plurality of holding means comprises three holding means for receiving said three least significant address signal, respectively, and
   said at least one inverting means receiving one of said three least significant address signals to output the inverted address signal to the corresponding one of said three holding means.

8. A burst length discriminating circuit claimed in claim 7 wherein said decoding means receives outputs of said three holding means, and activates a burst length discrimination signal indicating a burst length of 8 bits when all outputs of said three holding means are at the same logical level at the power-on time.

9. A burst length discriminating circuit claimed in claim 8 wherein said at least one inverting means receives the most significant address signal of said three least significant address signals to output the inverted address signal to the corresponding holding means of said three holding means.

10. A burst length discriminating circuit for use in a synchronous semiconductor memory with a burst mode, comprising:
    a plurality of holding means for latching and holding a corresponding number of address signals;
    at least one inverting means receiving one address signal of said address signal for supplying an inverted address signal to a corresponding holding means of said plurality of holding means; and
    a decoding means receiving output of said plurality of holding means for selectively activating one of a plurality of burst length discrimination signals determined by a combination of logical values of said address signals, said decoding means activating a burst length discrimination signal indicating a burst length other than a full page when the outputs of all said plurality of holding means are at the same logical level;
    wherein the burst length discriminating circuit receives the three least significant address signals of an address, and said plurality of holding means comprises three holding means for receiving said three least significant address signals, respectively,
    said at least one inverting means receives one of said three least significant address signals to output the inverted address signal to the corresponding holding means of said three holding means;
    said at least one inverting means includes an inverter receiving the most significant address signal of said three least significant address signals to output the inverted address signal;
    said three holding means include a first D-type flipflop having a data input connected to latch and hold the least significant address signal of said three least significant address signals in response to a clock signal, a second D-type flipflop having a data input connected to latch and hold the second least significant address signal of said three least significant address signals in response to said clock signal, and a third D-type flipflop having a data input connected to latch and hold said inverted address signal in response to clock signal; and
    said decoding means includes a two-input NOR circuit receiving an output of said first D-type flipflop and an output of said second D-type flipflop and outputting a first burst length discrimination signal, a two-input AND circuit receiving an inverted signal of said output of said first D-type flipflop and said output of said second D-type flipflop and outputting a second burst length discrimination signal, a three-input AND circuit receiving said output of said first D-type flipflop, said output of said second D-type flipflop and an output of said third D-type flipflop, and outputting a third burst length discrimination signal, and a three-input NOR circuit receiving said inverted signal of said output of said first D-type flipflop, an inverted signal of said output of said second D-type flipflop and the output of said third D-type flipflop, and outputting a fourth burst length discrimination signal indicating the full page.

11. A burst length discriminating circuit for use in a synchronous semiconductor memory with a burst mode, comprising:
    a plurality of holding means for latching and holding a corresponding number of address signals;
    one inverting means having its output connected to an input of one selected holding means of said plurality of holding means and its input receiving one address signal of said address signals for supplying an inverted address signal to said input of said one selected holding means; and
    a decoding means receiving outputs of said plurality of holding means for selectively activating one of a plurality of burst length discrimination signals determined by a combination of logical values of said address signals,
    said decoding means including logic which
    selectively activates a burst length discrimination signal indicative of a full page when said corresponding number of address signals are all at the same logical level to indicate said full page, and
    maintains said burst length discrimination signal indicative of said full page in an inactive condition, and
    selectively activates another burst length discrimination signal indicative of a burst length other than said full page, whenever the outputs of all said plurality of holding means are all at the same logical level.

12. The burst length discriminating circuit of claim 11, wherein, during a power-on, when the outputs of all said plurality of holding means are all in a high state and when the outputs of all said plurality of holding means are all in a low state, said decoding means never selects the burst length discrimination signal indicative of the full page.

13. The burst length discriminating circuit of claim 11, wherein, the truth table of the decoder is:

| IA2Q | IA1Q | IA0Q | MDBL1 | MDBL4 | MDBL8 | MDBLF |
|------|------|------|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 0 | 1 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 1 | 0 |

IA2Q, IA1Q, and IA0Q being decoder inputs and MDBL1, MDBL4, MDBL8, and MDBLF being decoder outputs, and the truth table of the burst length discriminating circuit is:

| IA2 | IA1 | IA0 | MDBL1 | MDBL4 | MDBL8 | MDBLF |
|-----|-----|-----|-------|-------|-------|-------|
| 0 | 0 | 0 | 1 | 0 | 0 | 0 |
| 0 | 0 | 1 | 0 | 0 | 0 | 0 |
| 0 | 1 | 0 | 0 | 1 | 0 | 0 |
| 0 | 1 | 1 | 0 | 0 | 1 | 0 |
| 1 | 0 | 0 | 1 | 0 | 0 | 0 |
| 1 | 0 | 1 | 0 | 0 | 0 | 0 |
| 1 | 1 | 0 | 0 | 1 | 0 | 0 |
| 1 | 1 | 1 | 0 | 0 | 0 | 1 |

IA2, IA1, and IA0 being the address signals.

14. A burst length discriminating circuit claimed in claim 11, wherein said plurality of holding means hold respective address signals in synchronism with a clock signal.

15. A burst length discriminating circuit claimed in claim 14, wherein each of said plurality of holding means comprises a D-type flipflop having a data input connected to receive a corresponding address signal and a clock input connected to receive said clock signal.

16. A burst length discriminating circuit claimed in claim 11, wherein the burst length discriminating circuit receives the three least significant address signals of an address, said plurality of holding means comprises three holding means for receiving said three least significant address signals, respectively, and said one inverting means receives one of said three least significant address signals to output the inverted address signal to a corresponding one of said three holding means.

17. A burst length discriminating circuit claimed in claim 16, wherein said one inverting means receives the most significant address signal of said three least significant address signals to output the inverted address signal to the corresponding holding means of said three holding means.

18. A burst length discriminating circuit claimed in claim 16, wherein said decoding means receives outputs of said three holding means, and activates a burst length discrimination signal indicating a burst length of 8 bits when all outputs of said three holding means are at the same logical level at the power-on time.

19. A burst length discriminating circuit claimed in claim 18, wherein said one inverting means receives the most significant address signal of said three least significant address signals to output the inverted address signal to the corresponding holding means of said three holding means.

* * * * *